United States Patent
Kim et al.

(10) Patent No.: US 11,545,485 B2
(45) Date of Patent: Jan. 3, 2023

(54) TYPE III-V SEMICONDUCTOR SUBSTRATE WITH MONOLITHICALLY INTEGRATED CAPACITOR

(71) Applicant: Infineon Technologies Austria AG, Villach (AT)

(72) Inventors: Hyeongnam Kim, Chandler, AZ (US); Mohamed Imam, Chandler, AZ (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/196,258

(22) Filed: Mar. 9, 2021

(65) Prior Publication Data

US 2022/0293589 A1 Sep. 15, 2022

(51) Int. Cl.
*H01L 21/00* (2006.01)
*H01L 27/06* (2006.01)

(52) U.S. Cl.
CPC ...... *H01L 27/0629* (2013.01); *H01L 27/0605* (2013.01)

(58) Field of Classification Search
CPC .............. H01L 27/0629; H01L 27/0605
See application file for complete search history.

(56) References Cited

U.S. PATENT DOCUMENTS 9,379,050 B2 * 6/2016 Hosseini ........... H01L 23/49575
9,570,438 B1 * 2/2017 Curatola ............. H01L 29/417
9,881,862 B1 * 1/2018 Otremba ............. H01L 23/3737
10,128,228 B1 * 11/2018 Gao ..................... H01L 29/7786
10,224,924 B1 * 3/2019 Leong ................ H01L 27/0727

(Continued)

FOREIGN PATENT DOCUMENTS

CN 101414633 A * 4/2009
CN 109475297 B * 3/2022 ........... G01N 27/414

(Continued)

OTHER PUBLICATIONS

Chen, Kevin J., et al., "Planar GaN Power Integration—The World is Flat", 2020 IEEE International Electron Devices Meeting (IEDM), Dec. 12, 2020, pp. 1-4.

(Continued)

*Primary Examiner* — Laura M Menz
(74) *Attorney, Agent, or Firm* — Murphy, Bilak & Homiller, PLLC

(57) ABSTRACT

A semiconductor die includes a barrier layer of type III-V semiconductor material, a channel layer of type III-V semiconductor material disposed below the barrier layer, the channel layer forming a heterojunction with the barrier layer such that a two-dimensional charge carrier gas is disposed in the channel layer near the heterojunction, a high-electron mobility transistor disposed in a first lateral region of the semiconductor die, the high-electron mobility transistor comprising source and drain electrodes that each are in ohmic contact with the two-dimensional charge carrier gas and a gate structure that is configured to control a conductive connection between the source and drain electrodes, and a capacitor that is monolithically integrated into the semiconductor die and is disposed in a second lateral region of the semiconductor die, a dielectric medium of the capacitor includes a first section of the barrier layer.

13 Claims, 4 Drawing Sheets

(56) References Cited

U.S. PATENT DOCUMENTS

| | | | |
|---|---|---|---|
| 10,332,876 B2* | 6/2019 | Siemieniec | H01L 29/7787 |
| 10,516,023 B2* | 12/2019 | Curatola | H01L 29/2003 |
| 10,644,142 B2* | 5/2020 | Yue | H01L 29/32 |
| 10,680,069 B2* | 6/2020 | Haeberlen | H02M 3/33507 |
| 10,720,913 B1* | 7/2020 | Leong | H03K 17/08142 |
| 10,840,353 B2* | 11/2020 | Curatola | H01L 29/2003 |
| 11,081,455 B2* | 8/2021 | Cha | H01L 24/03 |
| 11,289,593 B2* | 3/2022 | Curatola | H01L 21/26513 |
| 2014/0091311 A1 | 4/2014 | Jeon et al. | |
| 2015/0357455 A1* | 12/2015 | Ohno | H01L 29/7802 |
| | | | 257/194 |
| 2016/0056145 A1* | 2/2016 | Nagumo | H01L 27/0255 |
| | | | 257/76 |
| 2016/0086938 A1 | 3/2016 | Kinzer | |
| 2017/0025406 A1 | 1/2017 | Liao | |
| 2017/0033210 A1* | 2/2017 | Curatola | H01L 29/7787 |
| 2017/0040312 A1* | 2/2017 | Curatola | H01L 29/66143 |
| 2018/0033880 A1* | 2/2018 | Chen | H01L 29/4236 |
| 2018/0269282 A1* | 9/2018 | Yang | H01L 29/861 |
| 2019/0021623 A1* | 1/2019 | Ram | A61B 1/2736 |
| 2019/0198623 A1* | 6/2019 | Yue | H01L 29/36 |
| 2020/0098745 A1* | 3/2020 | Roig-Guitart | H01L 29/861 |
| 2020/0227547 A1* | 7/2020 | Yue | H01L 29/7786 |
| 2020/0300842 A1* | 9/2020 | Ram | G01N 27/4145 |
| 2020/0303534 A1* | 9/2020 | Ram | H01L 29/7786 |
| 2021/0344340 A1* | 11/2021 | Kim | H01L 29/7786 |
| 2022/0115287 A1* | 4/2022 | Woetzel | H01L 25/16 |
| 2022/0173235 A1* | 6/2022 | Curatola | H01L 29/0649 |

FOREIGN PATENT DOCUMENTS

| | | | | |
|---|---|---|---|---|
| DE | 102016114496 A1 * | 2/2017 | | H01L 21/02529 |
| EP | 3503202 A2 * | 6/2019 | | H01L 21/2233 |
| EP | 3813102 A1 * | 4/2021 | | H01L 27/0727 |

OTHER PUBLICATIONS

Sirvastava, Puneet, et al., "GaN High-Electron Mobility Transistor Track-and-Hold Sampling Circuit With Over 100-dB Signal-to-Noise Ratio", IEEE Electron Device Letters, vol. 37, No. 10, Jan. 10, 2016, pp. 1314-1317.

* cited by examiner

TYPE III-V SEMICONDUCTOR SUBSTRATE WITH MONOLITHICALLY INTEGRATED CAPACITOR

TECHNICAL FIELD

The instant application relates to semiconductor devices, and particularly relates to devices formed in type III-V semiconductor technology.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is formed from type III-V semiconductor material, e.g., gallium nitride (GaN), gallium arsenide (GaAs), etc. An HEMT includes a two-dimensional charge carrier gas that is created by a heterojunction between two layers of type III-V semiconductor material having different band gaps. The two-dimensional charge carrier gas is used by the HEMT to conduct the load current of the device. Because a two-dimensional charge carrier gas has an extremely high carrier mobility, this device concept offers very low on-resistance in comparison to other device technologies. For this reason, an HEMT is a popular choice as a switching device in power switching applications, i.e., applications requiring the control of voltages in excess of 250V, 500V, 1000V, etc. or greater, and/or the control of current in excess of 1A, 5A, 10A, etc.

In many applications such as power switching it is desirable to incorporate one or more passive components, e.g., capacitors, inductors, etc., in the same die as the active device. These passive components can perform a variety of desirable functions to improve the input or output characteristics of the switching device, e.g., current buffering, impedance matching, etc. By incorporating passive components into the semiconductor die, parasitic effects can be reduced in comparison to providing these components separately. However, incorporating passive components into a semiconductor die consumes additional die area. This additional die area increases the cost of producing each device and may be particularly pronounced in device technologies wherein the cost of producing and/or processing the semiconductor material is expensive such as type III-V semiconductor technology.

It is therefore desirable to incorporate a passive component into a semiconductor die at reduced expense.

SUMMARY

A semiconductor device is disclosed. According to an embodiment, the semiconductor device comprises a semiconductor die comprising a barrier layer of type III-V semiconductor material, a channel layer of type III-V semiconductor material disposed below the barrier layer. The channel layer forms a heterojunction with the barrier layer such that a two-dimensional charge carrier gas is disposed in the channel layer near the heterojunction, a high-electron mobility transistor disposed in a first lateral region of the semiconductor die, the high-electron mobility transistor comprising source and drain electrodes that each are in ohmic contact with the two-dimensional charge carrier gas and a gate structure that is configured to control a conductive connection between the source and drain electrodes, and a capacitor that is monolithically integrated into the semiconductor die and is disposed in a second lateral region of the semiconductor die, wherein a dielectric medium of the capacitor comprises a first section of the barrier layer.

Separately or in combination, the capacitor comprises a first parallel plate capacitor connected between first and second terminals of the capacitor, and a region of the two-dimensional charge carrier gas that is underneath the first section of the barrier layer forms a first electrode of the first parallel plate capacitor.

Separately or in combination, the semiconductor die comprises a first metallization layer disposed over the barrier layer, and a first section of the first metallization layer that is above the first section of the barrier layer forms a second electrode of the first parallel plate capacitor.

Separately or in combination, the semiconductor die comprises a first dielectric layer disposed over the barrier layer, and wherein the dielectric medium of the first parallel plate capacitor further comprises a first section of the first dielectric layer that is disposed on top of the first section of the barrier layer.

Separately or in combination, the first dielectric layer comprises any one or more of: silicon dioxide, silicon nitride, and silicon oxynitride.

Separately or in combination, the source and drain electrodes of the high-electron mobility transistor are each formed in the first metallization layer.

Separately or in combination, the capacitor further comprises a second parallel plate capacitor connected between the first and second terminals in parallel with the first parallel plate capacitor.

Separately or in combination, the second parallel plate capacitor is vertically stacked on top of the first parallel plate capacitor.

Separately or in combination, the semiconductor die further comprises a second dielectric layer and a second metallization layer that are each disposed over the barrier layer, and a dielectric medium of the second parallel plate capacitor comprises a first section of the second dielectric layer that is above the first metallization layer.

Separately or in combination, a first section of the second metallization layer that is above the first section of the second dielectric layer forms a first electrode of the first parallel plate capacitor, and a second electrode of the second parallel plate comprises the first section of the first metallization layer.

Separately or in combination, the semiconductor device further comprises a third parallel plate capacitor connected in parallel with the first and second parallel plate capacitors.

Separately or in combination, the semiconductor die comprises a third dielectric layer and a third metallization layer that are each disposed over the barrier layer, and a dielectric medium of the third parallel plate capacitor comprises a first section of the third dielectric layer that is above the second metallization layer.

Separately or in combination, a first section of the third metallization layer that is above the first section of the third dielectric layer forms a second electrode of the third parallel plate capacitor, and a first electrode of the third parallel plate comprises the first section of the second metallization layer.

According to another embodiment, the semiconductor device comprises a semiconductor die comprising a barrier layer of type III-V semiconductor material, a channel layer of type III-V semiconductor material disposed below the barrier layer, the channel layer forming a heterojunction with the barrier layer such that a two-dimensional charge carrier gas is disposed in the channel layer near the heterojunction, and a capacitor monolithically formed in the semiconductor die, wherein a dielectric medium of the capacitor comprises a first section of the barrier layer.

Separately or in combination, the capacitor is configured as a parallel plate capacitor, and a region of the two-dimensional charge carrier gas that is disposed below the first section of the barrier layer forms a first electrode of the parallel plate capacitor.

Separately or in combination, the semiconductor device further comprises a first dielectric layer formed over the barrier layer, and the dielectric medium of the capacitor further comprises a first section of the first dielectric layer that is disposed on top of the first section of the barrier layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A, 1B and 1C, illustrates a semiconductor device, according to an embodiment. FIG. 1A illustrates a cross-sectional view of a semiconductor die that comprises a high-electron mobility transistor and a monolithically integrated capacitor.

FIG. 1B illustrates a schematic of the high-electron mobility transistor. FIG. 1C illustrates a schematic of the capacitor.

FIG. 3A illustrates a cross-sectional view of a lateral region of a semiconductor die that comprises a monolithically integrated capacitor. FIG. 3B illustrates a schematic of the capacitor.

FIGS. 4A, 4B, illustrates a semiconductor device, according to an embodiment. FIG. 4A illustrates a cross-sectional view of a lateral region of a semiconductor die that comprises a monolithically integrated capacitor. FIG. 4B illustrates a schematic of the capacitor.

DETAILED DESCRIPTION

Embodiments of a capacitor that is monolithically integrated in a semiconductor die that comprises type III-V semiconductor material are described herein. The semiconductor die comprises type III-V semiconductor that comprises barrier and channel layers of type III-V semiconductor material. The barrier and channel layers form a heterojunction such that a two-dimensional charge carrier gas arises in the channel layer near the heterojunction. This basic arrangement can be used to form a high-electron mobility transistor in the semiconductor die that utilizes the two-dimensional charge carrier gas as an active device channel. The capacitor utilizes the same basic arrangement of the barrier and channel layers from the semiconductor die to form part of its charge storing structure. Specifically, a dielectric medium of the capacitor corresponds to a lateral section of the barrier layer, and a region of the two-dimensional charge carrier gas underneath the barrier layer corresponds to a first electrode of the capacitor. The second electrode of the capacitor is provided from a structured region of metallization on top of the barrier layer. This capacitor structure can be combined with further capacitor structures formed in superjacent dielectric and metallization layers that are vertically interdigitated with one another. By using the built-in features of the type III-V semiconductor substrate, a monolithically integrated capacitor with greater capacitance per area than previous solutions is produced.

Figure 1:
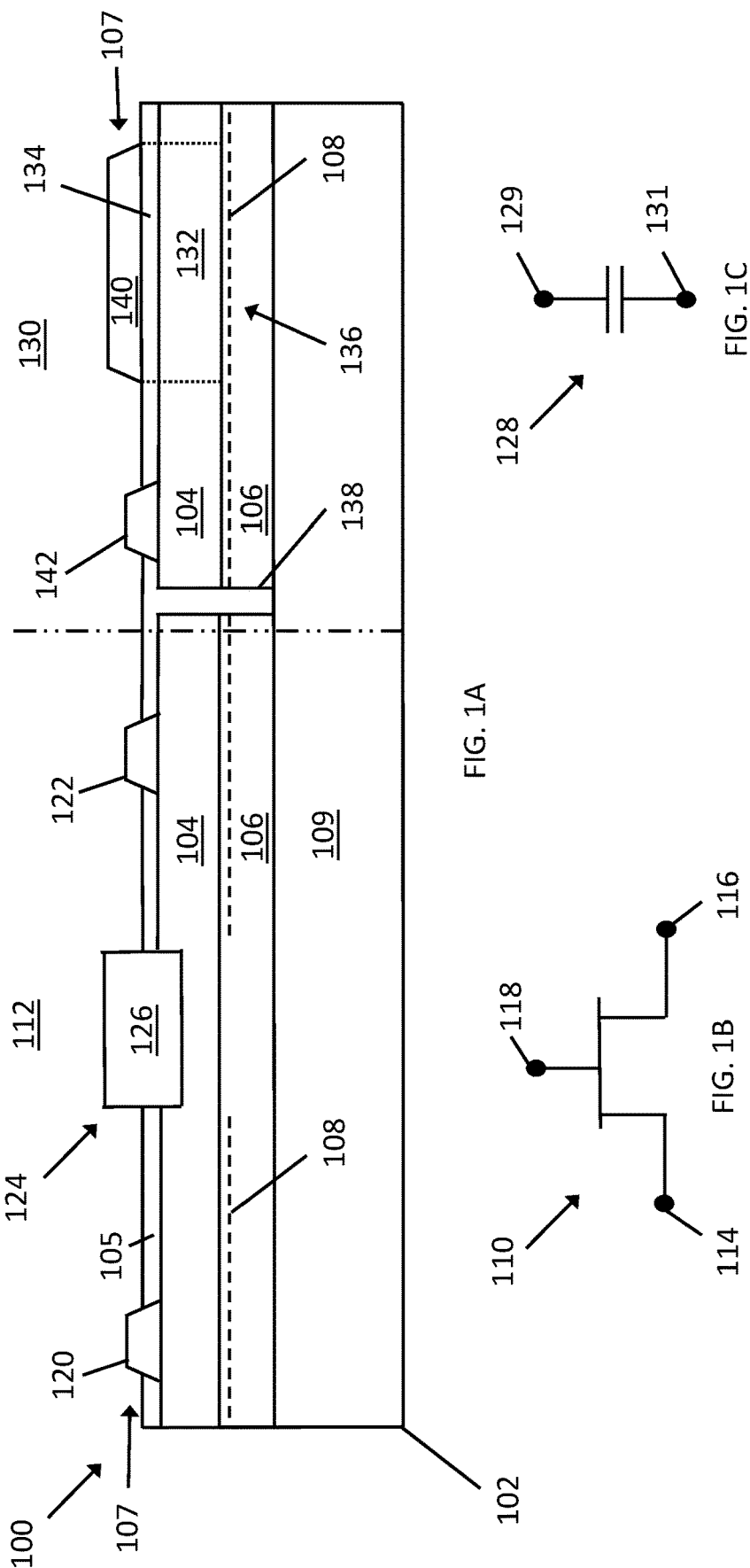
FIG. 1, which includes

Referring to FIG. 1, a semiconductor die 100 comprises a semiconductor substrate 102. The semiconductor substrate 102 comprises a barrier layer 104 and a channel layer 106 disposed below the barrier layer 104. The barrier layer 104 comprises type III-V semiconductor material and the channel layer 106 comprises type III-V semiconductor material with a different bandgap as the barrier layer 104. For instance, the channel layer 106 can comprise GaN or AlGaN and the barrier layer 104 can comprise AlGaN with a higher aluminum content as the channel layer 106. The channel layer 106 forms a heterojunction with the barrier layer 104 such that a two-dimensional charge carrier gas 108 is disposed in the channel layer 106 near the heterojunction interface. The term two-dimensional charge carrier gas 108 refers to a two-dimensional electron gas ("2DEG") or a two-dimensional hole gas ("2DHG"). In the above example wherein the channel layer 106 is a GaN layer and the barrier layer 104 is a layer of AlGaN, the two-dimensional charge carrier gas 108 is a 2DEG.

The semiconductor substrate 102 additionally comprises a back-barrier region 109 disposed below the channel layer 106. The back-barrier region 109 may comprise multiple layers of different semiconductor material that serve different purposes. For instance, the back-barrier region 109 may comprise a base substrate that extends to a rear surface of the semiconductor substrate 102. This base substrate can be a commercially available semiconductor wafer, e.g., a silicon wafer, SOI, sapphire, SiC, and some other ceramic based substrate, that is used to epitaxially grow type III-V semiconductor material thereon. A plurality of type III-V semiconductor layers may be formed on this base substrate below the channel layer 106. These type III-V semiconductor layers may have different crystalline properties, e.g., layers of GaN/AlGaN with different aluminum content, that are designed to alleviate mechanical stresses in the semiconductor substrate 102 resulting from lattice mismatch between the base substrate and the superjacent material.

The semiconductor die 100 further comprises a first dielectric layer 105 and a first metallization layer 107, with each layer each being disposed on an upper surface of the barrier layer 104. Generally speaking, the first dielectric layer 105 can comprise any of a variety of electrical insulators, such as $SiO_2$ (silicon dioxide), $Si_3N_4$ (silicon nitride), $SiO_NX_Y$ (silicon oxynitride), etc., including high-K dielectric materials such as $HfO_2$. A thickness of the first dielectric layer 105 can generally be in the range of 50 nm-200 nm. The first dielectric layer 105 can be formed by a deposition technique such as chemical vapor deposition (CVD), for example. Generally speaking, the first metallization layer 107 can comprise any of a variety of conductive metals such as aluminum, titanium, copper, nickel, tungsten, etc., and any alloys (i.e., Ti/Al/Ti) thereof. The first metallization layer 107 can be formed after forming the first dielectric layer 105, e.g., by a metal deposition technique such evaporation, plating, molecular beam epitaxy, sputtering, etc. The first dielectric layer 105 and the first metallization layer 107 can be formed into desired geometries using masked structuring techniques such as photolithography and/or etching.

A high-electron mobility transistor 110 is disposed in a first lateral region 112 of the semiconductor die 100. The high-electron mobility transistor 110 comprises a source terminal 114, a drain terminal 116, and a gate terminal 118. In a commonly known manner, the high-electron mobility transistor 110 is configured to control a conductive connection between the source and drain terminals 114, 116 through appropriate biasing of the gate terminal 118.

The semiconductor die 100 comprises source and drain electrodes 120, 122 that are formed in the first metallization layer 107. The source and drain electrodes 120, 122 are each in ohmic contact with the two-dimensional charge carrier gas 108. To this end, the source and drain electrodes 120, 122 may extend into the semiconductor substrate 102 to contact the two-dimensional charge carrier gas 108. Alternatively, this electrical connection may be provided by another conductive structure (not shown) formed in the semiconductor substrate 102. The source and drain electrodes 120, 122 may correspond to the source terminal 114 and the drain terminal 116 of the high-electron mobility transistor 110. That is, the source and drain electrodes 120, 122 may be externally accessible points of electrical contact. Alternatively, the semiconductor substrate 102 may comprise further layers of upper-level metallization (not shown) that are structured to comprise external bond pads that are electrically connected to the source and drain electrodes 120, 122.

The high-electron mobility transistor 110 additionally comprises a gate structure 124. The gate structure 124 comprises a gate electrode 126. The gate electrode 126 is formed from an electrical conductor such as a metal, e.g., aluminum, titanium, copper, nickel, tungsten, alloys thereof, etc., or a doped semiconductor, e.g., highly doped monocrystalline or polycrystalline semiconductors. The gate electrode 126 can be a part of the first metallization layer 107 or may be formed separately.

The working principle of the high-electron mobility transistor 110 is as follows. The two-dimensional charge carrier gas 108 is the active channel of the device. In an on-state of the device, the source and drain electrodes 120, 122 are electrically connected to one another via the two-dimensional charge carrier gas 108. In the off-state of the device, the two-dimensional charge carrier gas 108 is locally disrupted so that the source and drain electrodes 120, 122 are not connected to one another. The device is transitioned between the on-state and the off-state by the application of a gate potential to the gate electrode 126. This influences an electric field beneath the gate, which in turn determines whether the two-dimensional charge carrier gas 108 is locally disrupted. As shown, the gate electrode 126 is disposed within a trench formed in the barrier layer 104. This brings the gate electrode 126 closer to the two-dimensional charge carrier gas 108, thereby enabling better on-off control.

The depicted configuration illustrates just one potential device configuration of a high-electron mobility transistor 110 that can be provided in the first lateral region 112 of the semiconductor die 100. These potential device configurations may vary with respect to geometry, material type and arrangement of the features, provided that the above-described device concept is obtained. For example, the semiconductor substrate 102 may comprise additional dielectric layers that are used for different purposes, e.g., passivation layers used to protect the semiconductor material, gate dielectric layers used to provide a thin gate dielectric underneath the gate electrode 126, etc. Additionally, or alternatively, the gate structure 124 may additionally comprise a region of type III-V semiconductor material such as p-type GaN disposed underneath the gate electrode 126 that is configured to generate an electric field that disrupts the two-dimensional charge carrier gas 108 at zero gate bias, thereby providing a normally-off device. Additionally, or alternatively, the gate structure 124 may have a different geometry from what is shown and/or may not be disposed within a trench.

A capacitor 128 is disposed in a second lateral region 130 of the semiconductor die 100. The capacitor 128 comprises first and second terminals 129, 131. In a commonly known manner, the capacitor 128 is configured to store electrical energy between the first and second terminals 129, 131.

The capacitor 128 is monolithically integrated into the semiconductor die 100. This means that the conductive and dielectric structures that collectively form the charge-storing structure of capacitor 128 are formed by constituent components of the semiconductor die 100. These constituent components include layers or regions of type III-V semiconductor material from the semiconductor substrate 102 and the dielectric layers and/or conductive layers disposed thereon.

The capacitor 128 comprises a dielectric medium that comprises a first section 132 of the barrier layer 104 that is disposed in the second lateral region 130. As previously discussed, the barrier layer 104 of the semiconductor substrate 102 comprises a type III-V semiconductor material such as GaN/AlGaN. The relative dielectric constant of type III-V semiconductor material such as GaN is generally in the range of 9-10 (between 9.2 and 9.5 in the specific case of GaN). The thickness of the barrier layer 104 can be selected based upon desired capacitor characteristics such as capacitance and maximum voltage. Although type III-V semiconductor materials have a high dielectric constant, they generally have a lower dielectric strength than semiconductor-based oxide or nitride materials, e.g., silicon dioxide, silicon nitride, etc. The dielectric medium of the capacitor 128 may additionally comprise a first section 134 of the first dielectric layer 105 that is disposed above first section 132 of the barrier layer 104. As the dielectric strength of the materials used to form the first dielectric layer 105 (e.g., silicon nitride, silicon dioxide) is greater than that of the barrier layer 104, this configuration enables higher voltage operation (e.g., above 20V, above 50V, above 100V, etc.) without the possibility of dielectric breakdown. Meanwhile, the thickness of the barrier layer 104 can remain at values that are well-suited for the performance of the high-electron mobility transistor 110, e.g., in the range of 7 nm to 100 nm.

According to an embodiment, the capacitor 128 is configured as a parallel plate capacitor. A parallel plate capacitor refers to a type of capacitor wherein the electrodes form conductive two-dimensional planes that are parallel to one another and with the dielectric medium interposed between the planar electrode structures. The capacitance of a parallel plate capacitor is determined by the following equation (1):

$$C = k\varepsilon_0 (A/D) \tag{1}$$

where: C is the capacitance (in farads);
A is the area of overlap of the electrodes on either side of the dielectric medium;
k is the relative permittivity of the dielectric medium;
$\varepsilon_0$ is the dielectric permittivity of a vacuum; and
d is the separation between the plates.

A first electrode of the capacitor 128 is provided by a region 136 of the two-dimensional charge carrier gas 108 that is underneath the first section 132 of the barrier layer 104. As the two-dimensional charge carrier gas 108 is electrically conductive and expands along a two-dimensional area along the interface between barrier layer 104 and the channel layer 106, it essentially acts as a "built in" plate for a parallel plate capacitor structure. The semiconductor substrate 102 may additionally comprise a dielectric structure 138 that laterally isolates the two-dimensional charge carrier gas 108 in the second lateral region 130 from the two-dimensional charge carrier gas 108 in the first lateral region 112. In this way, the capacitor 128 can operate independently from the high-electron mobility transistor 110. The dielectric structure 138 can comprise an electrical insulator, e.g., silicon dioxide, silicon nitride, etc., disposed within a trench formed in the semiconductor substrate 102. More generally, any lateral electrical isolation structure is possible.

A second plate of the capacitor 128 is provided by a first section 140 of the first metallization layer 107 that is above the first section 132 of the barrier layer 104 and (optionally) the first section 134 of the first dielectric layer 105. The area of overlap between the first section 140 of the first metallization layer 107 and the two-dimensional charge carrier gas 108 define the area of overlap (A) in the above-provided equation (1). Put another way, the first metallization layer 107 is structured in such a way to form a parallel plate electrode, thus completing the capacitor structure using the "built-in" dielectric medium and conductive plate provided by the semiconductor substrate 102.

A second section 142 of the first metallization layer 107 that is formed in the second lateral region 130 is in low-ohmic contact with the two-dimensional charge carrier gas 108, e.g., in a similar manner as the source and drain electrodes 120, 122, and thus enables electrical contact to the first electrode of the capacitor 128. The first and second terminals 129, 131 of the capacitor 128 can respectively correspond to the first and second sections 140, 142 of the of the first metallization layer 107. Alternatively, the semiconductor substrate 102 may comprise further layers of upper-level metallization (not shown) that are structured to comprise external bond pads that are electrically connected to the first and second sections 140, 142.

The first and second terminals 129, 131 of the capacitor 128 can be series-connected or parallel-connected with the source terminal 114, the drain electrode 116 and/or the gate terminal 118 of the high-electron mobility transistor 110 in any possible arrangement. These electrical connections may be provided by forming interconnections in the first metallization layer 107 and/or any metallization layer disposed thereon, for example.

Figure 2:
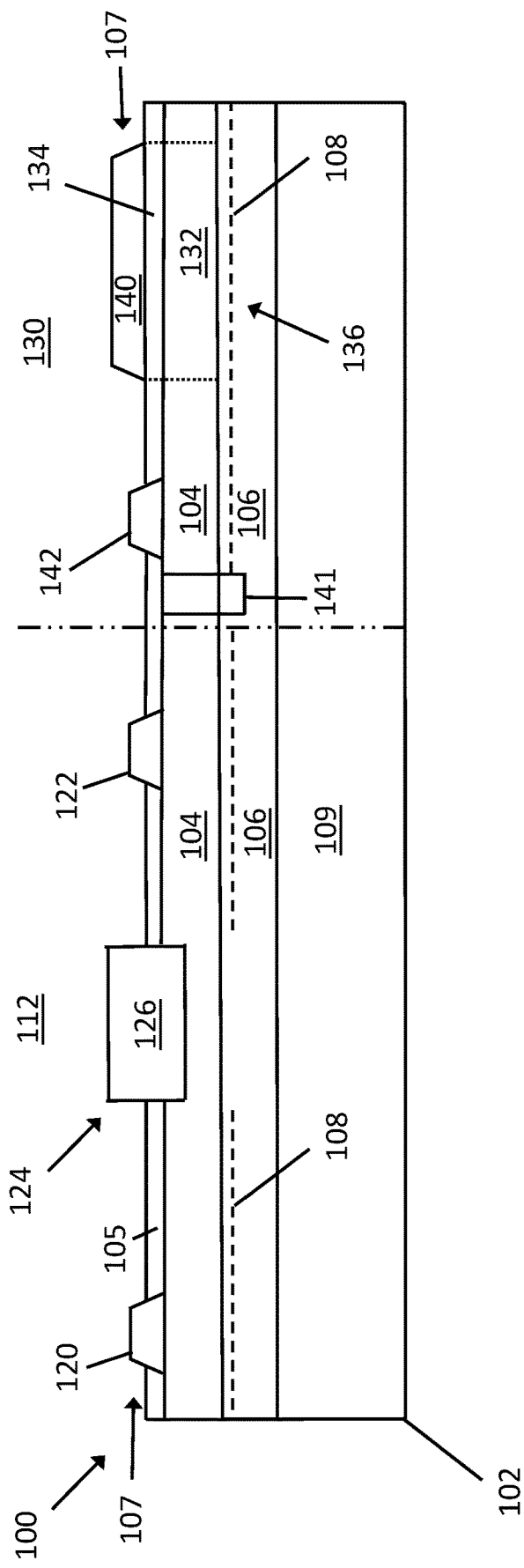
FIG. 2 illustrates a cross-sectional view of a semiconductor die that comprises a high-electron mobility transistor and a monolithically integrated capacitor, according to another embodiment FIG. 3, which includes

Referring to FIG. 2, a semiconductor die 100 is depicted, according to another embodiment. The semiconductor die 100 differs from the embodiment of FIG. 1 in that a damaged region 141 is provided instead of the dielectric structure. The damaged region 141 is a portion of the semiconductor substrate 102 wherein crystalline defects are intentionally created in the material. As a result, the two-dimensional charge carrier gas 108 is disrupted such that the two-dimensional charge carrier gas 108 in the second lateral region 130 is isolated from is isolated from the two-dimensional charge carrier gas 108 in the first lateral region 112 in a similar manner as described above. The damaged region 141 can be created by ion implantation, for example.

Figure 3:
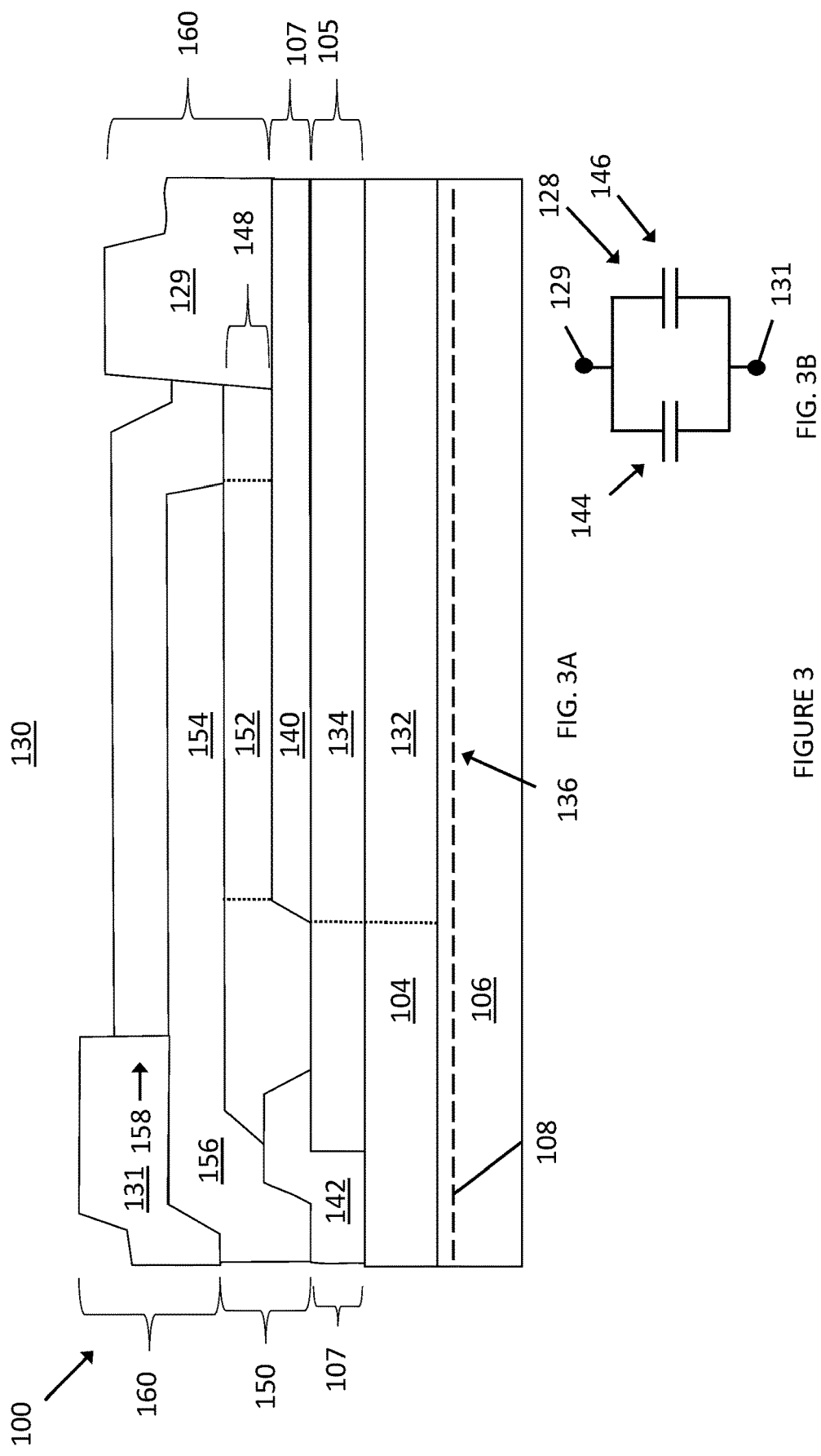
FIGS. 3A and 3B, illustrates a semiconductor device, according to an embodiment.

Referring to FIG. 3, the second lateral region 130 of the semiconductor substrate 102 is shown, according to another embodiment. In this embodiment, the monolithically integrated capacitor 128 comprises first and second parallel plate capacitors 144, 146 connected in parallel with one another. The first parallel plate capacitor 144 is a parallel plate capacitor formed by the two-dimensional charge carrier gas 108, the first section 132 of the barrier layer 104, (optionally), the first section 134 of the first dielectric layer 105, and the first section 140 of the first metallization layer 107 according to the configuration described with reference to FIG. 1. The second parallel plate capacitor 146 is connected in parallel with the first parallel plate capacitor 144 and therefore adds to the overall capacitance of the capacitor 128. The second parallel plate capacitor 146 is vertically stacked on top of the first parallel plate capacitor 144. This means that the dielectric medium of the second parallel plate capacitor 146 at least partially overlaps with the dielectric medium of the first parallel plate capacitor 144. As a result, the overall capacitance of the capacitor 128 is increased without adding a commensurate amount of additional chip area for the second parallel plate capacitor 146.

The semiconductor substrate 102 comprises a second dielectric layer 148 and a second metallization layer 150 that are each disposed over an upper surface of the barrier layer 104. The second dielectric layer 148 is formed after forming the first metallization layer 107. The second metallization layer 150 is formed after forming the second dielectric layer 148. The second metallization layer 150 and the second dielectric layer 148 can have the same material composition and can be formed according to the same techniques as the first metallization layer 107 and the first dielectric layer 105, respectively.

The dielectric medium of the second parallel plate capacitor 146 corresponds to a first section 152 of the second dielectric layer 148 that is above the first metallization layer 107. A first electrode of the second parallel plate capacitor 146 corresponds to a first section 154 of the second metallization layer 150 that is above the first section 152 of the second dielectric layer 148. The first electrode of the second parallel plate capacitor 146 is electrically connected to the first electrode of the first parallel plate capacitor 144, both of which connect with the second terminal 131 of the capacitor. As shown in FIG. 2, this electrical connection can be effectuated by a second section 156 of the second metallization layer 150 which contacts the second section 142 of the first metallization layer 150. Meanwhile, the second conductive plate of the second parallel plate capacitor 146 comprises the first section 140 of the first metallization layer 107. That is, the same structure which forms the second conductive plate of the first parallel plate capacitor 144 also forms at least part of the second conductive plate of the second parallel plate capacitor 146.

The semiconductor die 100 further comprises a third dielectric layer 158 and a third metallization layer 160 that are each disposed over the upper surface of the barrier layer 104. The third dielectric layer 158 is formed after forming the second metallization layer 150. The third metallization layer 160 is formed after forming the second dielectric layer 148. The third metallization layer 160 and the third dielectric layer 158 can have the same material composition and can be formed according to the same techniques as the first metallization layer 107 and the first dielectric layer 105, respectively.

In the embodiment of FIG. 3, the third metallization layer 160 is structured to form externally accessible contact structures (bond pads) which correspond to the first and second terminals 129, 131 of the capacitor 128. The third dielectric layer 158 provides an outermost surface of the semiconductor die 100 in between these contact structures which protects the device from contamination.

Figure 4:
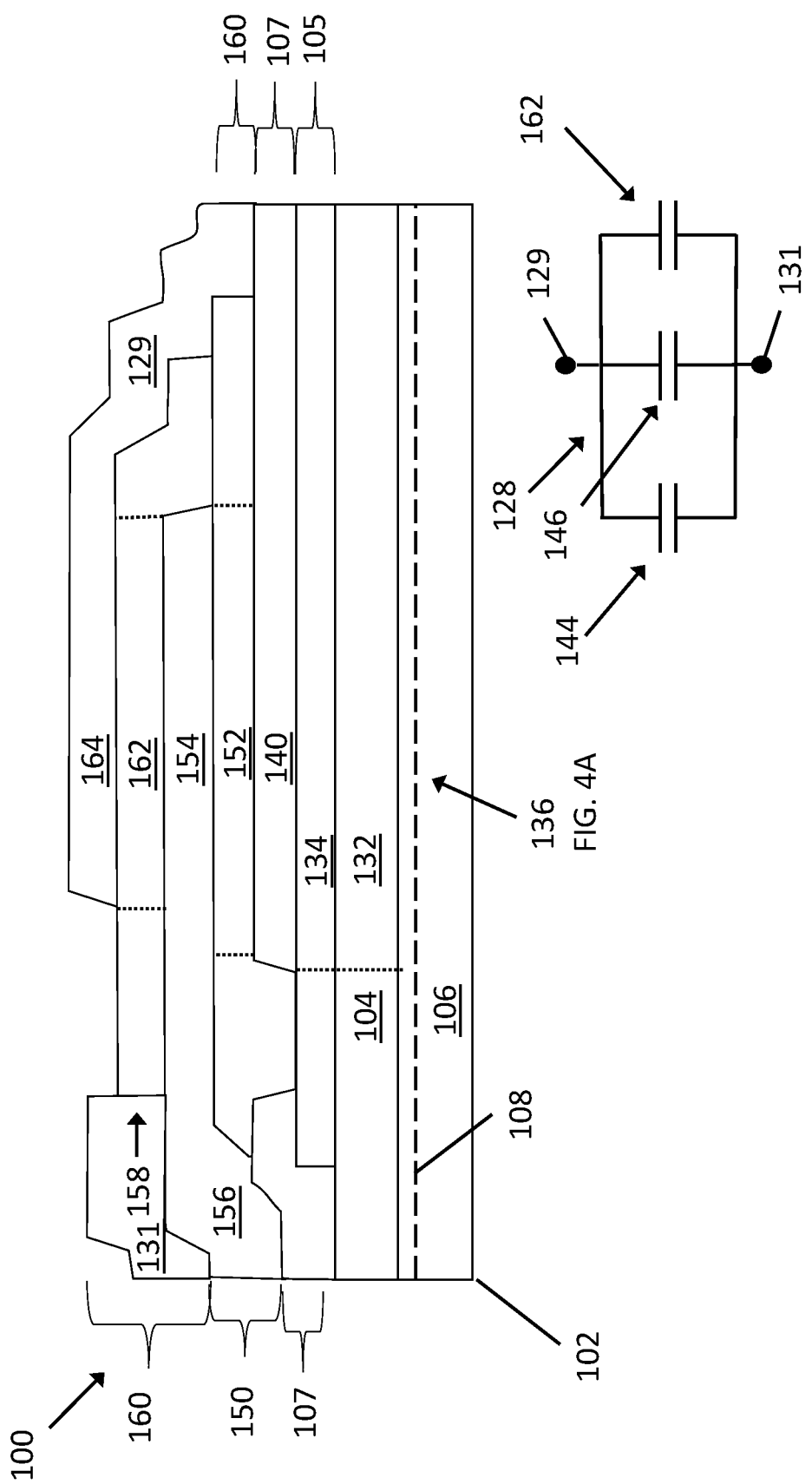
FIG. 4, which includes

Referring to FIG. 4, the second lateral region 130 of the semiconductor die 100 is shown, according to another embodiment. In this embodiment, the monolithically integrated capacitor 128 comprises first, second and third parallel plate capacitors 144, 146, 162. The first and second parallel plate capacitors 144, 146 have the same configuration as the embodiment of FIG. 3. The third parallel plate capacitor 162 that is connected in parallel with the first and second parallel plate capacitors 144, 146 and is vertically stacked on top of the first and second parallel plate capacitors 144, 146. As a result, the overall capacitance of the capacitor 128 is increased without adding commensurate amount of additional chip area for the third parallel plate capacitor 162.

The third parallel plate capacitor 162 is obtained through structuring of the third metallization layer 160 to form an additional parallel plate electrode. Specifically, the third metallization layer 160 is structured so that a first section 162 of the third dielectric layer 158 is covered by a first section 164 of the third metallization layer 164. The first section 162 of the third dielectric layer 158 forms the dielectric medium of the third parallel plate capacitor 162. The first section 164 of the third metallization layer 164 forms a second conductive plate of the third parallel plate capacitor 162 that is electrically connected to the second conductive plates of the first and second parallel plate capacitors by direct contact with the first metallization layer 107. Meanwhile, the second conductive plate of the third parallel plate capacitor 162 comprises the first section 154 of the second metallization layer 150. That is, the same structure which forms the first conductive plate of the second parallel plate capacitor 146 also forms at least part of the first conductive plate of the third parallel plate capacitor 162.

The vertical stacking concept illustrated by the embodiments of FIGS. 2 and 3 can be used to further increase the capacitance of the capacitor 128 by correspondingly adding and structuring metallization and dielectric. That is, the semiconductor die 100 can be formed to comprise further layers of metallization and dielectric material that are arranged alternatively and structured to form further plate structures. As a result, a monolithically integrated capacitor 128 that consists of four, five, six, etc. parallel plate capacitors 128 can be obtained. In addition or in the alternative, the semiconductor die 100 can be configured to comprise two or more isolated capacitor structures by incorporating the capacitor 128 disclosed herein in two or more laterally isolated regions of the semiconductor die 100.

The semiconductor die 100 described herein can comprise a semiconductor substrate 102 comprising any combination of type III-V semiconductor materials capable of forming a two-dimensional charge carrier gas at a heterojunction between type III-V semiconductor materials of different bandgap. These type III-V semiconductor materials include binary III-V semiconductor materials such as Gallium nitride (GaN), gallium arsenide (GaAs), aluminium nitride (AlN), aluminium arsenide (AlAs), indium nitride (InN), indium arsenide (InAs), etc., and ternary or quarternary type III-V semiconductor materials such as aluminium gallium nitride (AlGaN), aluminium gallium arsenide (AlGaAs), indium gallium nitride (InGaN), indium aluminium gallium nitride (InAlGaN), etc.

As used herein, the phrase "type III-V semiconductor material" refers to a compound material that includes at least one Group III element, such as aluminum (Al), gallium (Ga), indium (In), and boron (B) and at least one Group IV element, such as nitrogen (N), phosphorous (P), and arsenic (As), and including but not limited to any of its alloys, such as aluminum gallium nitride (AlxGa(1-x)N), indium gallium nitride (InyGa(1-y)N), aluminum indium gallium nitride (AlxInyGa(1-x-y)N), gallium arsenide phosphide nitride (GaAsAsPbN(1-a-b)), and aluminum indium gallium arsenide phosphide nitride (AlxInyGa(1-x-y)AsaPbN(1-a-b)), for example. Aluminum gallium nitride and AlGaN refers to an alloy described by the formula AlxGa(1-x)N, where 0<x<1.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor die comprising a barrier layer of type III-V semiconductor material, a channel layer of type III-V semiconductor material disposed below the barrier layer, the channel layer forming a heterojunction with the barrier layer such that a two-dimensional charge carrier gas is disposed in the channel layer near the heterojunction;
a high-electron mobility transistor disposed in a first lateral region of the semiconductor die, the high-electron mobility transistor comprising source and drain electrodes that each are in ohmic contact with the two-dimensional charge carrier gas and a gate structure that is configured to control a conductive connection between the source and drain electrodes; and
a capacitor that is monolithically integrated into the semiconductor die and is disposed in a second lateral region of the semiconductor die,
wherein a dielectric medium of the capacitor comprises a first section of the barrier layer.

2. The semiconductor device of claim 1, wherein the capacitor comprises a first parallel plate capacitor connected between first and second terminals of the capacitor, and wherein a region of the two-dimensional charge carrier gas that is underneath the first section of the barrier layer forms a first electrode of the first parallel plate capacitor.

3. The semiconductor device of claim 2, wherein the semiconductor die comprises a first metallization layer disposed over the barrier layer, and wherein a first section of the first metallization layer that is above the first section of the barrier layer forms a second electrode of the first parallel plate capacitor.

4. The semiconductor device of claim 3, wherein the semiconductor die comprises a first dielectric layer disposed over the barrier layer, and wherein the dielectric medium of the first parallel plate capacitor further comprises a first section of the first dielectric layer that is disposed on top of the first section of the barrier layer.

5. The semiconductor device of claim 4, wherein the first dielectric layer comprises any one or more of: silicon dioxide, silicon nitride, and silicon oxynitride.

6. The semiconductor device of claim 4, wherein the source and drain electrodes of the high-electron mobility transistor are each formed in the first metallization layer.

7. The semiconductor device of claim 3, wherein the capacitor further comprises a second parallel plate capacitor connected between the first and second terminals in parallel with the first parallel plate capacitor.

8. The semiconductor device of claim 7, wherein the second parallel plate capacitor is vertically stacked on top of the first parallel plate capacitor.

9. The semiconductor device of claim 8, wherein the semiconductor die further comprises a second dielectric layer and a second metallization layer that are each disposed over the barrier layer, and wherein a dielectric medium of the second parallel plate capacitor comprises a first section of the second dielectric layer that is above the first metallization layer.

10. The semiconductor device of claim 9, wherein a first section of the second metallization layer that is above the first section of the second dielectric layer forms a first electrode of the first parallel plate capacitor, and wherein a second electrode of the second parallel plate capacitor comprises the first section of the first metallization layer.

11. The semiconductor device of claim 9, further comprising a third parallel plate capacitor connected in parallel with the first and second parallel plate capacitors.

12. The semiconductor device of claim 11, wherein the semiconductor die comprises a third dielectric layer and a third metallization layer that are each disposed over the barrier layer, and wherein a dielectric medium of the third parallel plate capacitor comprises a first section of the third dielectric layer that is above the second metallization layer.

13. The semiconductor device of claim 12, wherein a first section of the third metallization layer that is above the first section of the third dielectric layer forms a second electrode of the third parallel plate capacitor, and wherein a first electrode of the third parallel plate comprises the first section of the second metallization layer.

\* \* \* \* \*